(12) United States Patent
Huang et al.

(10) Patent No.: US 8,772,100 B2
(45) Date of Patent: Jul. 8, 2014

(54) STRUCTURE AND METHOD FOR FORMING A LOW GATE RESISTANCE HIGH-K METAL GATE TRANSISTOR DEVICE

(71) Applicant: GLOBALFOUNDRIES Inc., Grand Cayman (KY)

(72) Inventors: Jingyan Huang, Beacon, NY (US); Keith Kwong Hon Wong, Wappingers Falls, NY (US)

(73) Assignee: Global Foundries Inc., Grand Cayman (KY)

( * ) Notice: Subject to any disclaimer, the term of this patent is extended or adjusted under 35 U.S.C. 154(b) by 40 days.

(21) Appl. No.: 13/654,987

(22) Filed: Oct. 18, 2012

(65) Prior Publication Data

US 2014/0110790 A1   Apr. 24, 2014

(51) Int. Cl.
    *H01L 21/8238* (2006.01)
(52) U.S. Cl.
    USPC .......................................... 438/199; 438/592
(58) Field of Classification Search
    USPC ................. 438/199, 592; 257/369, 410, 407
    See application file for complete search history.

(56) References Cited

U.S. PATENT DOCUMENTS

| | | |
|---|---|---|
| 5,244,535 A | 9/1993 | Ohtsuka et al. |
| 6,074,941 A | 6/2000 | Hsieh et al. |
| 6,232,217 B1 | 5/2001 | Ang et al. |
| 6,431,182 B1 | 8/2002 | Rakhshandehroo et al. |
| 7,217,652 B1 | 5/2007 | Yang |
| 7,531,896 B1 | 5/2009 | Drizlikh et al. |
| 7,759,796 B2 | 7/2010 | Hirota |
| 7,786,005 B2 | 8/2010 | Yamamoto et al. |
| 8,207,595 B2 | 6/2012 | Hsieh et al. |
| 8,564,072 B2 * | 10/2013 | Chan et al. ................... 257/407 |
| 2006/0205192 A1 | 9/2006 | Walther et al. |
| 2006/0249755 A1 | 11/2006 | Kuo et al. |

* cited by examiner

*Primary Examiner* — Mark Prenty
(74) *Attorney, Agent, or Firm* — Hunter E. Webb; Keohane & D'Alessandro, PLLC

(57) ABSTRACT

A low gate resistance high-k metal gate transistor device is formed by providing a set of gate stacks (e.g., replacement metal gate (RMG) stacks) in a trench on a silicon substrate. The gate stacks in the trench may have various layers such as: a high-k layer formed over the substrate; a barrier layer formed over the high-k layer; a p-type work function (pWF) layer formed over the barrier layer; and an n-type work function (nWF) layer formed over the pWF layer. The nWF layer will be subjected to a nitrogen containing plasma treatment to form a nitridized nWF layer on the top surface, and an Al containing layer will then be applied over the gas plasma treated layer. By utilizing a gas plasma treatment, the gap within the trench may remain wider, and thus allow for improved Al fill and reflow at high temperature (400° C.-480° C.) subsequently applied thereto.

10 Claims, 5 Drawing Sheets

STRUCTURE AND METHOD FOR FORMING A LOW GATE RESISTANCE HIGH-K METAL GATE TRANSISTOR DEVICE

BACKGROUND

1. Technical Field

This invention relates generally to the field of semiconductors and, more particularly, to improved approaches for fabricating a replacement high-k metal gate transistor device.

2. Related Art

The semiconductor integrated circuit (IC) industry has experienced rapid growth in recent years. Specifically, generations of ICs have been produced whereby each generation has smaller and more complex circuits than the previous generation. However, for these advances to be realized, developments in IC processing and manufacturing are needed. Under this course of IC evolution, functional density (i.e., the number of interconnected devices per chip area) has generally increased while geometry size (i.e., the smallest component that can be created using a fabrication process) has decreased.

Replacement high-k metal gate stacks have been commonly adopted as a way to meet aggressive scaling in metal-oxide semiconductor field effect transistor (MOSFET) technology. While there may be different integration processes to achieve a final structure, a common step in many schemes involves first forming a polysilicon "dummy" gate. The dummy gate is removed by an etch process, which can be wet or a combination of wet and RIE, and the space is then backfilled with the metal gate stack. In one approach, the high-k dielectric is deposited during the dummy gate build process, and the dielectric is then retained. In another last scheme, a high-k dielectric is deposited first before the metal gate stack into the space left after the poly gate removal. Two sets of metal gate stacks are needed to satisfy the different work function requirement of the PFET and NFET transistors.

A typical PFET metal gate stack may comprise titanium nitride (TiN), ruthenium (Ru), titanium nitride (TiNi), and an NFET metal gate may comprise titanium aluminum (TiAl). To lower gate resistance, a layer of metal such as aluminum (Al) is deposited over the work function metal. In a full complimentary metal-oxide semiconductor field effect transistor (CMOS FET) build, some scheme may have an additional etch barrier. In a PFET metal first scheme, PFET metal is deposited firstly followed by its removal from NFET transistor, then NFET metal is deposited on both NFET and PFET. In a NFET metal first scheme, NFET and PFET work function metal deposition sequence is opposite. One challenge of replacement metal gate schemes is to fill the dummy gate with enough work function metal (WFM) and Al to meet both the device performance and gate resistance specification. Unfortunately, it has been found that Al can diffuse through the WFM layer towards the dielectric causing device degradation. This tendency is even more pronounced in the PFET metal first scheme.

SUMMARY OF THE INVENTION

A structure and method for forming/providing a low gate resistance high-k metal gate transistor device is provided that maximizes the volume and eliminates voids in the metal (e.g., Al) fill in the replacement metal gates (RMGs). In general, the device is formed by providing a set of gate stacks (e.g., replacement metal gate (RMG) stacks) in a trench on a silicon substrate. The gate stacks in the trench may have various layers such as: a high-k layer (e.g., hafnium dioxide ($HfO_2$)) formed over the substrate; a barrier layer (e.g., titanium nitride (TiN), tantalum nitride (TaN), etc.) formed over the high-k layer; a p-type work function (pWF) layer (e.g., titanium nitride (TiN)) formed over the barrier layer; and a n-type work function (nWF) layer (e.g., titanium aluminide (TiAl)) formed over the pWF layer. The nWF layer will be subjected to a nitrogen containing plasma treatment (e.g., nitrogen ($N_2$), ammonia ($NH_3$) gas, etc.) to form a nitridized nWF layer on a top surface of the gate stacks, and an Al containing layer will then be applied over the gas plasma treated layer. By utilizing a gas plasma treatment (e.g., as opposed to applying an additional layer of TiN or the like over the nWF layer), the gap within the trench may remain wider, and thus allow for improved Al fill and reflow at high temperature (400° C.-480° C.) subsequently applied thereto.

A first aspect of the present invention provides a method for forming a low gate resistance high-k metal gate transistor device, comprising: forming a set of gate stacks in a trench over a substrate, the set of gate stacks having an initial n-type work function (nWF) layer on a top surface of the set of gate stacks; nitridizing the initial nWF layer with a nitrogen containing gas plasma, thereby forming a nitridized nWF layer at the top surface; and applying an aluminum (Al) containing layer over the nitridized nWF layer and reflowing the device to fill the trench.

A second aspect of the present invention provides a method for forming a low gate resistance high-k metal gate transistor device, comprising: forming a set of gate stacks and a trench over a substrate, the set of gate stacks and the trench having a n-type work function (nWF) layer along a top surface; applying a gas plasma over the n-type work function (nWF) layer of the set of gate stacks and the trench; forming a metal layer over the gas plasma treated layer; and applying a temperature in a range of about 400° C. to about 480° C. to the device to cause a reflow of the metal layer.

A third aspect of the present invention provides a low gate resistance high-k metal gate transistor device, comprising: a set of gate stacks in a trench formed over a substrate; the set of gate stacks having an initial n-type work function (nWF) layer on top surface of the device; a nitridized nWF layer formed on the top surface of the nWF layer through a nitrogen containing gas plasma treatment; and an aluminum (Al) containing layer formed over the gas nitridized nWF layer to fill the trench during device reflow.

BRIEF DESCRIPTION OF THE DRAWINGS

These and other features of this invention will be more readily understood from the following detailed description of the various aspects of the invention taken in conjunction with the accompanying drawings in which.

Figure 1:
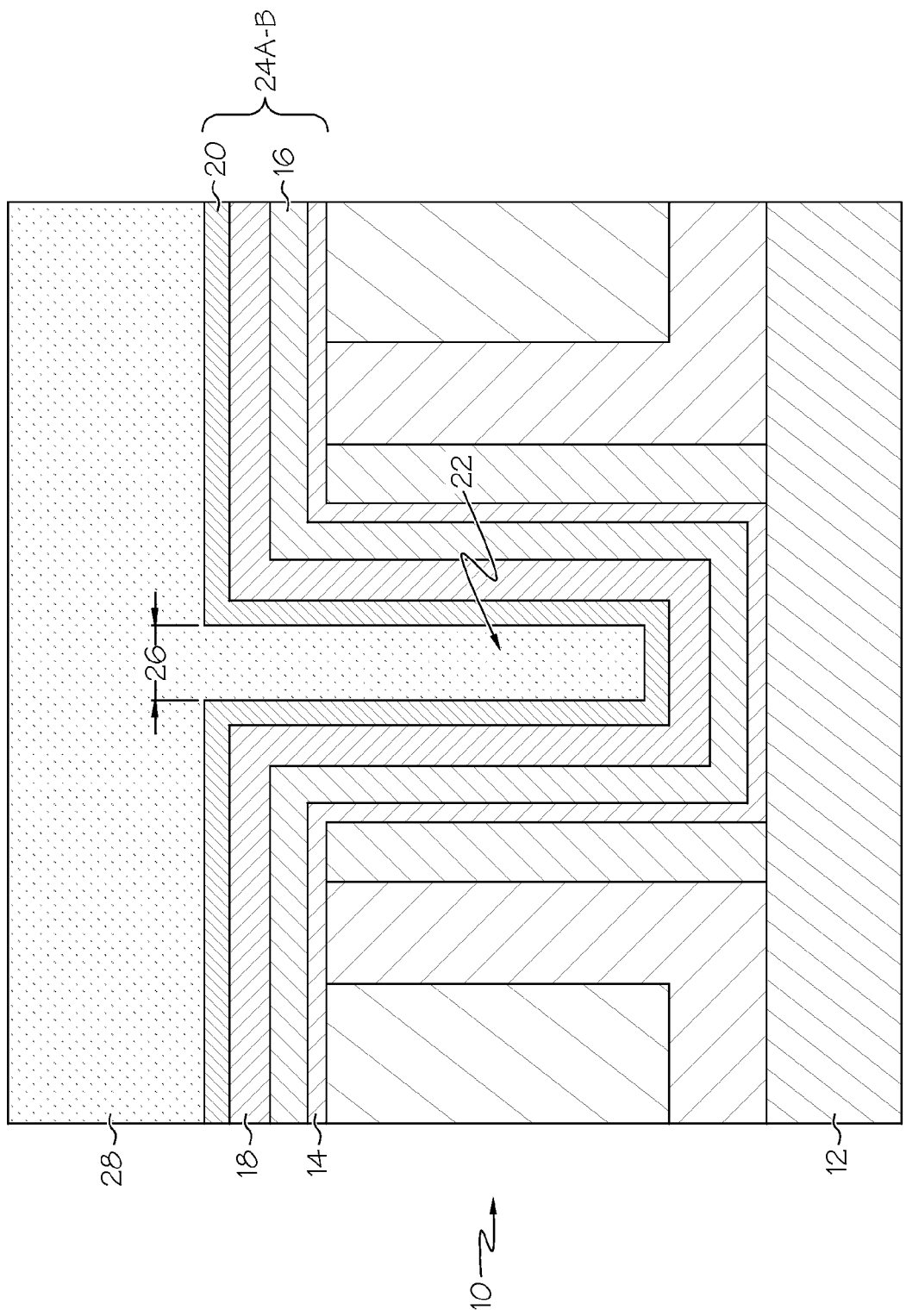
FIG. 1 shows a structure of a replacement high-k metal gate semiconductor device.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION OF THE INVENTION

Illustrative embodiments will now be described more fully herein with reference to the accompanying drawings, in which embodiments are shown. This disclosure may, however, be embodied in many different forms and should not be construed as limited to the embodiments set forth herein. Rather, these embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. The term "set" is intended to mean a quantity of at least one. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath", or "below" mean that a first element, such as a first structure (e.g., a first layer) is present on a second element, such as a second structure (e.g. a second layer) wherein intervening elements, such as an interface structure (e.g. interface layer) may be present between the first element and the second element.

As indicated above, a structure and method for forming/providing a low gate resistance high-k metal gate transistor device is provided that maximizes the volume and eliminates voids in the metal (e.g., Al) fill in the replacement metal gates (RMGs). In general, the device is formed by providing a set of gate stacks (e.g., replacement metal gate (RMG) stacks) in a trench on a silicon substrate. The gate stacks in the trench may have various layers such as: a high-k layer (e.g., hafnium dioxide ($HfO_2$)) formed over the substrate; a barrier layer (e.g., titanium nitride (TiN), tantalum nitride (TaN), etc.) formed over the high-k layer; a p-type work function (pWF) layer (e.g., titanium nitride (TiN)) formed over the barrier layer; and a n-type work function (nWF) layer (e.g., titanium aluminide (TiAl)) formed over the pWF layer. The nWF layer will be subjected to a nitrogen containing plasma treatment (e.g., nitrogen ($N_2$), ammonia ($NH_3$) gas, etc.) to form a nitridized nWF layer on a top surface of the gate stacks, and an Al containing layer will then be applied over the gas plasma treated layer. By utilizing a gas plasma treatment (e.g., as opposed to applying an additional layer of TiN or the like over the nWF layer), the gap within the trench may remain wider, and thus allow for improved Al fill and reflow during subsequent processing (e.g., application of high temperature (400° C.-480° C.)).

Referring now to FIG. 1, a replacement high-k metal gate semiconductor device 10 is shown. As depicted, device 10 includes a set of replacement metal gate (RMG) stacks 24A-B in a trench 22 formed over a substrate 12. Various layers such as shown may be utilized to create such features. Specifically for PFET transistor with PFET metal first scheme, as shown, gate stacks 24A-B in trench 22 may have a high-k dielectric layer (e.g., hafnium dioxide ($HfO_2$)) 14 formed over substrate 12; a barrier layer (e.g., titanium nitride (TiN), tantalum nitride (TaN)) 16 formed over high-k layer 14; a p-type work function (pWF) layer (e.g., titanium nitride (TiN)) 18 formed over barrier layer 16; and a n-type work function (nWF) layer (e.g., titanium aluminide (TiAl)) 20 formed over the pWF layer 18. At this point in the processing, trench 22 has a gap 26 therein. Subsequently, as indicated above, typical processing involves applying an Al containing layer 28 over nWF layer 20 so that Al may fill gap 26 and trench 22 with a reflow at high temperature (400° C.-480° C.). One problem with this reflow process is the fast diffusion rate of Al at high temperature. Specifically, Al could penetrate through the underneath gate stacks and cause gate leakage and device reliability degradation.

Figure 2:
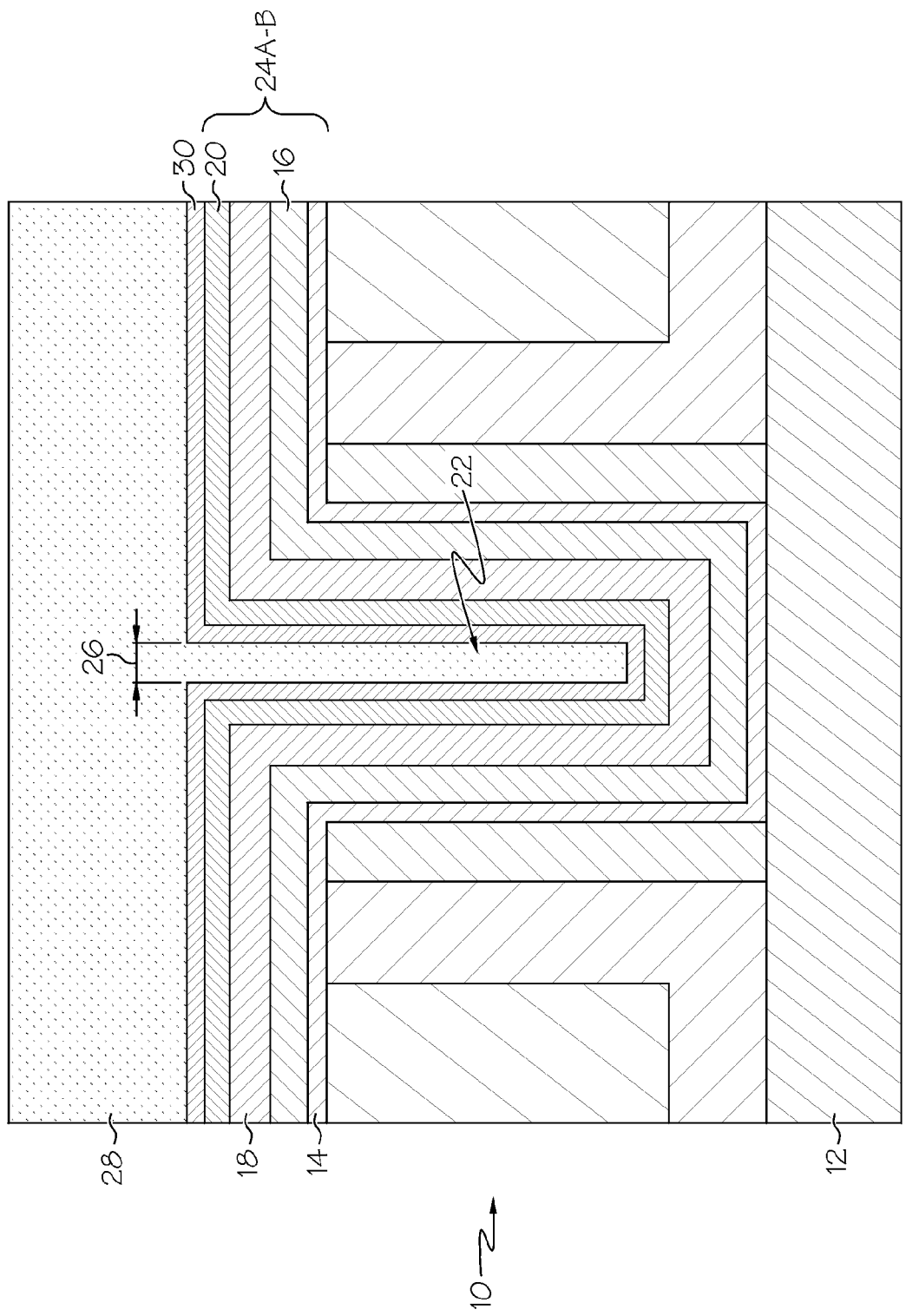
FIG. 2 shows a structure of another replacement high-k metal gate semiconductor device.
Figure 3:
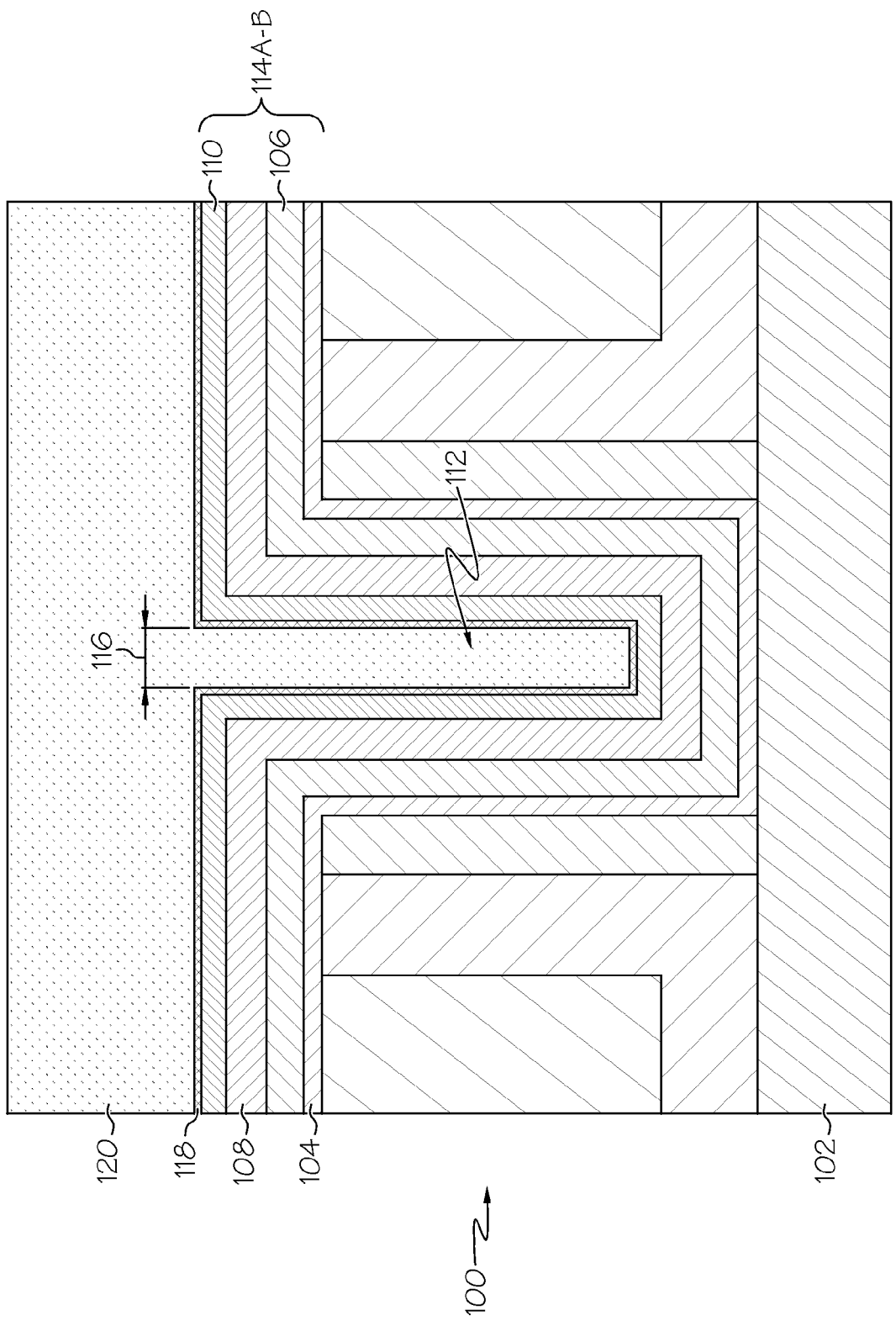
FIG. 3 shows a structure of a replacement high-k metal gate semiconductor device according to an embodiment of the present invention.
Figure 4:
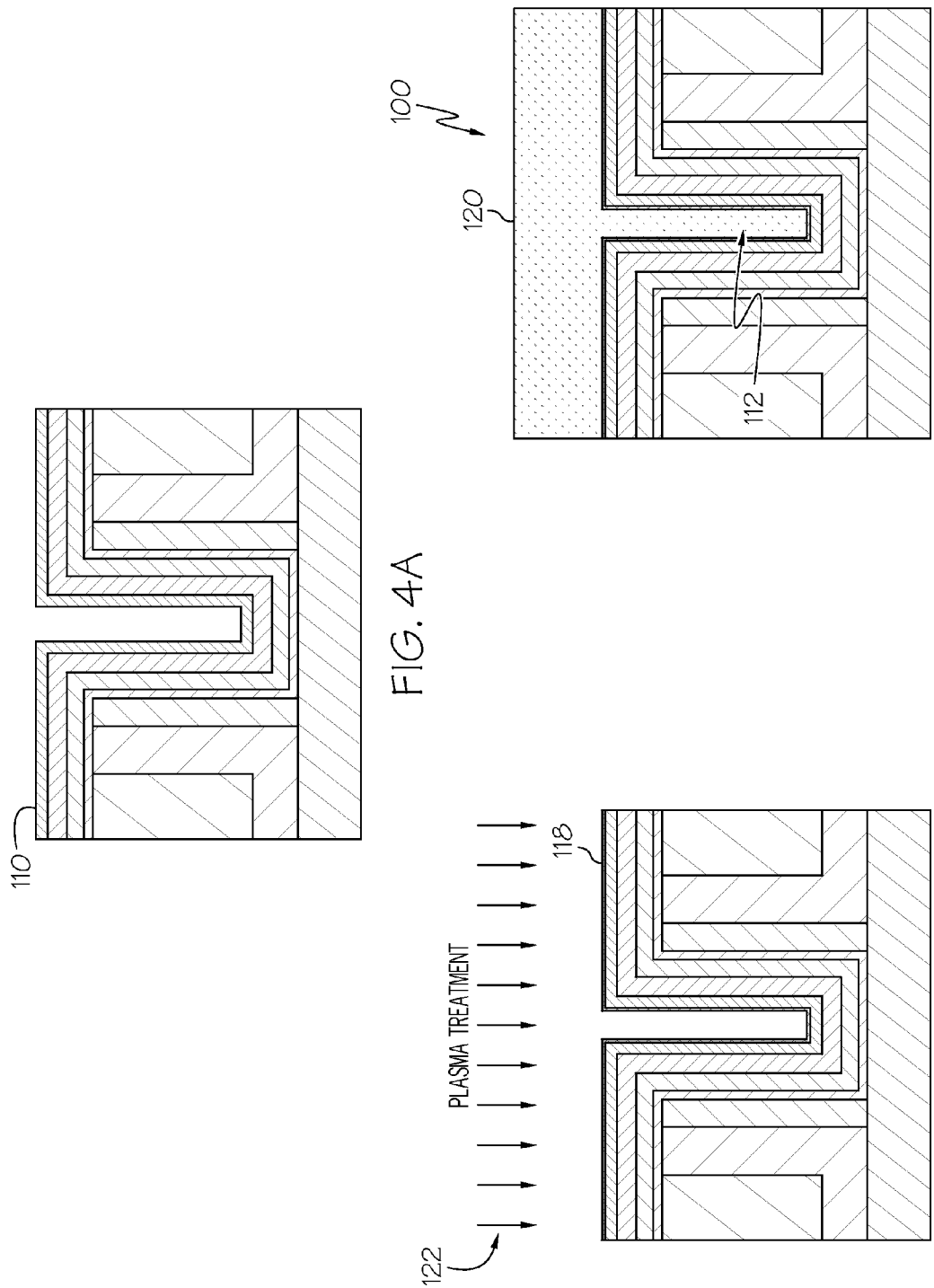
FIGS. 4A-C shows a process flow diagram which illustrates the progression/method for forming a replacement high-k metal gate semiconductor device according to an embodiment of the present invention.

Referring now to FIG. 2, one existing approach is shown to solve the device degradation due to high temperature Al reflow. As depicted in FIG. 2, an additional barrier layer (e.g., titanium nitride (TiN)) 30 is provided. This barrier layer can effectively suppress Al diffusion at high reflow temperature. However, application of such a layer has caused gap 26 of trench 22 to become significantly narrower. Such an approach reduced the ability of a subsequent Al 28 to fully fill trench 22 even with high reflow temperature (400° C.-480° C.). The void formed in the replacement metal gate would result in high gate resistance.

Referring now to FIGS. 3 and 4A-C, a replacement high-k metal gate semiconductor device 100 and steps during its formation are shown according to an embodiment of the present invention. As depicted, device 100 includes a set of replacement metal gate (RMG) stacks 114A-B in a trench 112 formed over a substrate 102. Various layers such as shown may be utilized to create such features. Specifically for PFET transistor with a PFET metal first scheme, as shown, gate stacks 114A-B in trench 112 may have a high-k dielectric layer (e.g., hafnium dioxide ($HfO_2$), hafnium silicate ($HfSiO_4$), zirconium oxide (ZrO), zirconium silicate ($ZrSiO_4$) or a composite layer of thereof) 104 formed over substrate 102; a barrier layer (e.g., titanium nitride (TiN), tantalum nitride (TaN)) 106 formed over high-k layer 104; a p-type work function (pWF) layer (e.g., titanium nitride (TiN)) 108 formed over barrier layer 106; and a n-type work function (nWF) layer (e.g., titanium aluminide (TiAl)) 110 formed over the pWF layer 108. At this point in the process, trench 112 has a gap 116 therein. At this point a nitrogen containing gas plasma treatment is applied over nWF layer 110 (e.g. TiAl) to form a top nitridized nWF metal layer 118 (e.g. TiAlN). The subsequent steps involve the deposit of an Al containing layer 120 through chemical vapor deposition (CVD) or physical vapor deposition (PVD) approach and Al reflow at high temperature to fill the trench 112. Plasma treatment 122 instead of the insertion of additional barrier layer, can maintain the width of gap 116 and allow the full fill of subsequent Al in replacement metal gate trench 112.

Figure 5:
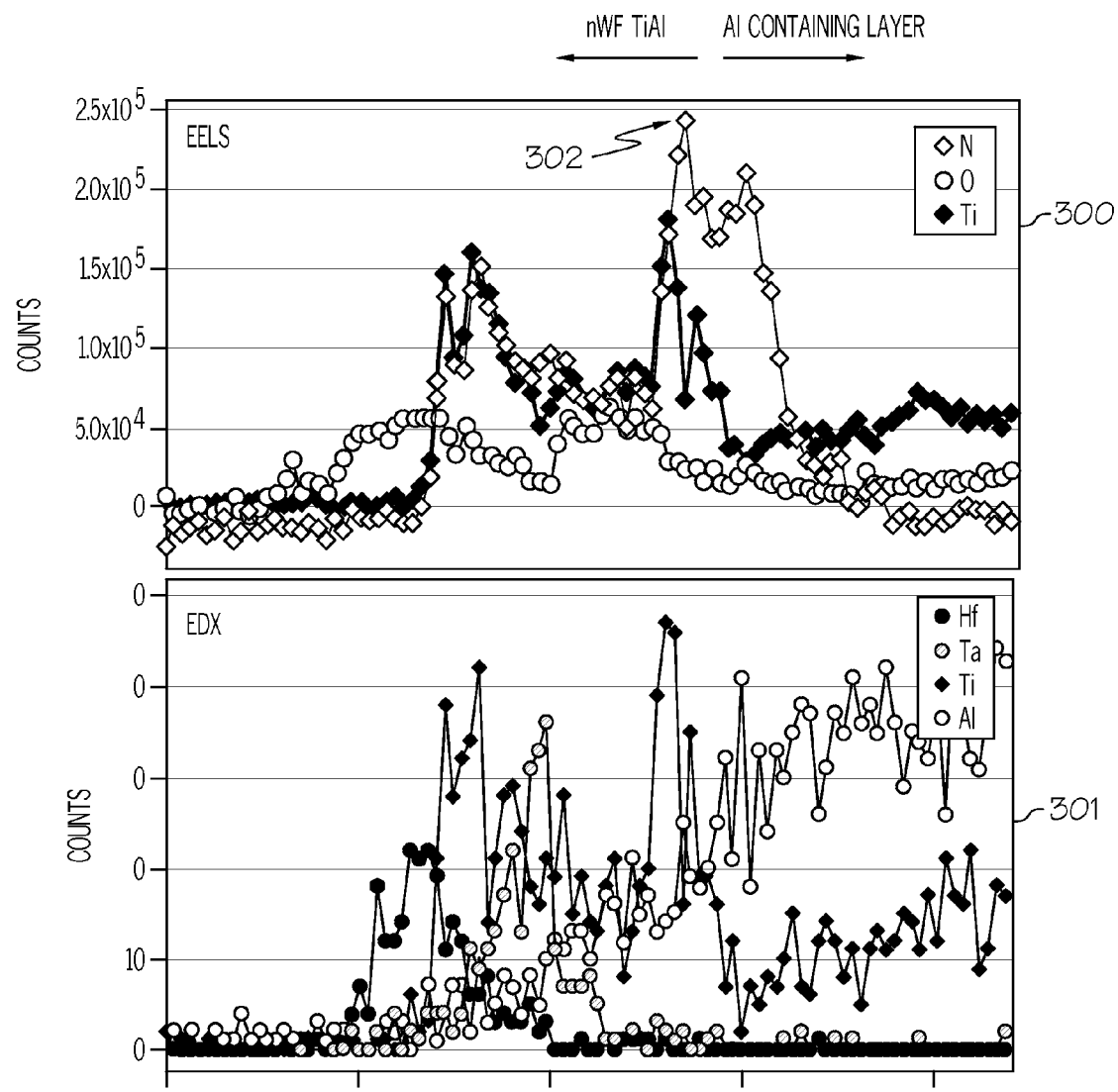
FIG. 5 show graphs of nitrogen presence during an approach according to an embodiment of the present invention.

Referring now to FIG. 5, graphs of element presence (in counts) versus position on device are shown, according to an embodiment of the present invention. Specifically, EELS graph 300 and EDX graph 301 analysis provides information of element (N, O, Ti, Hf, Ta and Al) intensity versus the position distance from the Si substrate. As shown, Nitrogen content is approaching $2.5 \times 10^5$ counts at an interface 302 of nWF TiAl and Al (or Al containing alloy). Nitrogen concentration increase is caused by the N containing plasma treatment over nWF metal. Both Ti and Al in TiAl alloy was nitridized to form TiAlN at the top surface. High nitrogen content would retard the Al diffusion in the subsequent Al reflow at high temperature (400° C.-480° C.), which minimizes gate leakage and improves device reliability. Under high reflow temperature, Al can easily fill the replacement high-k metal gate and provides low gate resistance.

More specifically, the plasma treatment can occur on a nWF metal surface in the presence of an nitrogen containing gas (for example $N_2$, $NH_3$) at power range of about 100 W-4000 W, at a temperature range of about 25° C. to about 400° C., at a pressure range of about 0.01-5 Torr. In a preferred embodiment, the nitridation process is carried out in the presence of $N_2$ gas, at RF power of 3000 W and pressure of 0.6 Torr, in a single wafer chamber with RPS (remote plasma source).

In various embodiments, design tools can be provided and configured to create the data sets used to pattern the semiconductor layers as described herein. For example, data sets can be created to generate photomasks used during lithography operations to pattern the layers for structures as described herein. Such design tools can include a collection of one or more modules and can also include hardware, software, or a combination thereof. Thus, for example, a tool can be a collection of one or more software modules, hardware modules, software/hardware modules, or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, application-specific integrated circuits (ASIC), programmable logic arrays (PLA)s, logical components, software routines, or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a low gate resistance high-k metal gate transistor device, comprising:
   forming a set of gate stacks in a trench over a substrate, the set of gate stacks having an initial n-type work function (nWF) layer on a top surface of the set of gate stacks;
   nitridizing the initial nWF layer with a nitrogen containing gas plasma, thereby forming a nitridized nWF layer at the top surface; and
   applying an aluminum (Al) containing layer over the nitridized nWF layer and reflowing the device to fill the trench.

2. The method of claim 1, the set of gate stacks comprising a set of replacement metal gate stacks (RMGs).

3. The method of claim 1, the forming of the set of gate stacks comprising:
   forming a high-k dielectric layer over the substrate;
   forming a barrier layer over the high-k layer;
   forming a p-type work function (pWF) layer over the barrier layer and the nWF layer over the pWF layer to yield a PFET transistor device; and
   forming the nWF layer over the barrier for a NFET transistor device.

4. The method of claim 1, wherein the nitridizing the initial nWF layer further comprises applying a plasma treatment over the initial nWF layer in the presence of a nitrogen ($N_2$) gas or an ammonia ($NH_3$) gas.

5. The method of claim 4, wherein the nitridizing the initial nWF metal is carried out with plasma treatment at power range of about 100W-4000W, at a temperature range of about 25° C. to about 400° C., and at a pressure range of about 0.01-5 Torr.

6. The method of claim 1, wherein the applying Al containing layer is carried out through chemical vapor deposition (CVD) or physical vapor deposition (PVD) approach; and Al containing layer comprising Al or Al—Ti alloy.

7. The method of claim 1, wherein reflowing is performed at a high temperature range of about 400° C. to 480° C.

8. A method for forming a low gate resistance high-k metal gate transistor device, comprising:
   forming a set of gate stacks in a trench over a substrate, the set of gate stacks having a n-type work function (nWF) layer along a top surface;
   applying a gas plasma over the n-type work function (nWF) layer of the set of gate stacks;
   forming a metal layer over the gas plasma treated layer; and
   applying a temperature in a range of about 400° C. to about 480° C. to the device to cause a reflow of the metal layer.

9. The method of claim 8, the forming of the set of gate stacks comprising:
   forming a high-k dielectric layer over the substrate;
   forming a barrier layer over the high-k layer;

forming a p-type work function (pWF) layer over the barrier layer and the nWF layer over the pWF layer to yield a PFET transistor device; and forming the nWF layer over the barrier for a NFET transistor device.

10. The method of claim 8, the gas plasma comprising a nitrogen containing gas plasma.

\* \* \* \* \*

UNITED STATES PATENT AND TRADEMARK OFFICE
CERTIFICATE OF CORRECTION

PATENT NO. : 8,772,100 B2  Page 1 of 1
APPLICATION NO. : 13/654987
DATED : July 8, 2014
INVENTOR(S) : Huang et al.

It is certified that error appears in the above-identified patent and that said Letters Patent is hereby corrected as shown below:

On the Title Page, Item (73) Assignee:

Delete "Global Foundries Inc." and Insert -- GLOBALFOUNDRIES Inc. --.

Signed and Sealed this
Thirtieth Day of September, 2014

Michelle K. Lee
*Deputy Director of the United States Patent and Trademark Office*